(12) United States Patent
Hiratsuka

(10) Patent No.: US 6,285,248 B1
(45) Date of Patent: Sep. 4, 2001

(54) SEMICONDUCTOR INTEGRATED CIRCUIT, OPERATING STATE DETECTOR, AND ELECTRONIC EQUIPMENT

(75) Inventor: Akihiro Hiratsuka, Hino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/341,529

(22) PCT Filed: Nov. 13, 1998

(86) PCT No.: PCT/JP98/05116

§ 371 Date: Sep. 7, 1999

§ 102(e) Date: Sep. 7, 1999

(87) PCT Pub. No.: WO99/26290

PCT Pub. Date: May 27, 1999

(30) Foreign Application Priority Data

Nov. 13, 1997 (JP) .................................................... 9-312115

(51) Int. Cl.$^7$ ........................................................ G05F 1/10
(52) U.S. Cl. ............................................. 327/544; 327/540
(58) Field of Search ............................ 327/73, 157, 159, 327/530, 538, 540, 544; 324/160, 76.53, 76.39, 76.47

(56) References Cited

U.S. PATENT DOCUMENTS

| | | | |
|---|---|---|---|
| 4,852,126 | * 7/1989 | Tanaka et al. | 327/73 |
| 5,892,407 | * 4/1999 | Ishii | 327/159 |
| 5,894,243 | * 4/1999 | Hwang | 327/540 |
| 5,982,835 | * 11/1999 | Kim et al. | 327/159 |

FOREIGN PATENT DOCUMENTS

| | | |
|---|---|---|
| 5-259289 | 10/1993 | (JP) . |
| 6-61429 | 3/1994 | (JP) . |
| 6-348354 | 12/1994 | (JP) . |

* cited by examiner

*Primary Examiner*—Jung Ho Kim
(74) *Attorney, Agent, or Firm*—Oliff & Berridge, PLC

(57) ABSTRACT

The present invention relates to a semiconductor integrated circuit having function blocks with differing operating frequencies and to a semiconductor integrated circuit wherein the threshold voltages of MOS transistors that configure these function blocks are different for each function block. In first to Nth function blocks (30-1 to 30-N), which are supplied with constant voltages ($V_{C1}$ to $V_{CN}$) generated by a constant voltage generation section (20) as power voltages, any variation in operating speed or in the capability of the transistors is detected by an operating state detector (40) as a voltage ($V_{fre}$). Further, an operating state encoding section (50) encodes the voltage ($V_{fre}$), a voltage output control section (60) modifies basic voltages ($V_{B1}$ to $V_{BN}$) of the constant voltage generation section (20), and constant voltages ($V_{C1}$ to $V_{CN}$) for the function blocks (30-1 to 30-N) is modified.

12 Claims, 10 Drawing Sheets

SEMICONDUCTOR INTEGRATED CIRCUIT, OPERATING STATE DETECTOR, AND ELECTRONIC EQUIPMENT

TECHNICAL FIELD

The present invention relates to an improvement in a semiconductor integrated circuit and electronic equipment using the same, comprising a constant voltage generation section that increases or decreases a power voltage supplied from an external power source to generate a constant voltage, and a function block that uses the constant voltage generated from the constant voltage generation section as a power source.

BACKGROUND OF ART

An example of this type of semiconductor integrated circuit is shown in FIG. 11. In FIG. 11, a reference power voltage 2 obtained from an external power source 1 is supplied to a constant voltage generation device 3. The constant voltage generation device 3 generates a fixed constant voltage 4, based on the reference power voltage 2, and supplies it as a power voltage to first and second function blocks 6A and 6B. The first and second function blocks 6A and 6B convert any input signals 5A and 5B based on corresponding specific functions, to generated output signals 7A and 7B having specific functions. When the first and second function blocks 6A and 6B are in a standby state, the operation of the corresponding first and second function blocks 6A and 6B is halted and the current supplied from the output constant voltage 4 is reduced by suppressing the signals 5A and 5B by function stop signals 8A and 8B.

With a conventional semiconductor integrated circuit, the constant voltage 4 is necessary for enabling response at the highest operating speed for all operating states for converting any input signals 5A and 5B to specific functions.

However, when the constant voltage 4 is supplied at the highest operating speed in all of the operating states of the first and second function blocks 6A and 6B, even if it is necessary for one function block 5A to operate at the highest speed, it could happen that such an operating speed is not required for the other function block 5B. As a case in which the difference between the highest operating speed and the lowest operating speed in operation is extremely large, it is possible to consider that a data access circuit and a frequency converter are used in common within the semiconductor integrated circuit.

If prior-art techniques are used, a high power voltage corresponding to the highest response speed will be necessary for one function block 6A in such a case, and it is not possible to control the power consumption.

With prior-art techniques, although it is possible to reduce the operating current on standby, a large amount of operating current is consumed during operation when the semiconductor integrated circuit contains at least two circuits having different operating speed respectively and there is an extremely large difference between the highest operating speed and the lowest operating speed while in the operating state, because the power voltage while in the operating state is supplied as a voltage level at a signal response that is enabled by the highest operating speed of the function blocks. It is therefore difficult to guarantee the circuit response speed at both the highest operating speed and the lowest operating speed necessary for the function blocks, while simultaneously implementing a reduction in power current.

The MOS transistors that configure the plurality of function blocks often have different threshold voltages, due to unevenness in the semiconductor wafer surface during the manufacturing process. This raises a technical problem in that the frequency response speeds will be different for each function block, even if the same power voltage is supplied to all of the function blocks operating at the same speed.

An objective of the present invention is to provide a semiconductor integrated circuit and electronic equipment using the same which solve the previously described technical problems and make it possible to reduce the operating current flowing during operation and thus reduce the power consumption, even if there are at least two circuits, which have different operating speed respectively, coexisting within the semiconductor integrated circuit, and the difference between the highest operating speed and the lowest operating speed is extremely large.

Another objective of the present invention is to provide a semiconductor integrated circuit and electronic equipment using the same which make it possible to reduce variations in the frequency response speeds of a plurality of function blocks, even when the manufacturing process has created differences in the threshold voltages of MOS transistors configuring those function blocks and the same power voltage is supplied to the function blocks operating at the same operating speed.

DISCLOSURE OF INVENTION

A semiconductor integrated circuit in accordance with the present invention comprises:

at least one constant voltage generation section for increasing or decreasing a power voltage supplied from at least one external power source, based on a basic voltage, to generate at least one constant voltage;

at least one function block to which is supplied the at least one constant voltage generated by the at least one constant voltage generation section;

at least one operating state detection section for generating a second signal indicating an operating state of the at least one function block, based on a first signal including operating speed information of the at least one function block;

at least one operating state encoding section for encoding an operating state of the function block to generate operating state data, based on the second signal; and at least one voltage output control section for modifying the basic voltage of the at least one constant voltage generation section, based on the operating state data.

The semiconductor integrated circuit of this aspect of the invention makes it possible to obtain the optimal power voltage necessary for the operation of the function blocks, based on the generation of a second signal indicating the operating state of these function blocks, which in turn is based on a first signal comprising operating speed information (the actual operating frequency) of each function block. The semiconductor integrated circuit of the present invention also makes it possible to implement the supply of the optimal power voltage corresponding to the operating speed of each function block, even when the threshold voltages of the MOS transistors thereof vary from the design values during the manufacturing process.

This aspect of the invention makes it possible to achieve the effect of reducing the power consumption by setting power voltages that are optimized for the operation of each of the function blocks from a signal period in which rapid operation is necessary to a signal period in which the response during low-speed operation is sufficient.

With this aspect of the present invention, an operating-setting signal is preferably input to each function block, and that function block supplies the first signal to the at least one operating state detection section when the operating-setting signal is active.

In such a case, the operating-setting signal could be set in such a manner that it becomes active at timings on the time axis that differ for each of the plurality of function blocks.

This means that one each of the at least one operating state detection section, at least one operating state encoding section, at least one voltage output control section, and at least one constant voltage generation section can be used in common for the plurality of function blocks.

With this aspect of the present invention, the voltage output control section may comprise a digital-analog converter for performing a digital-to-analog conversion on the operating state data; and a sample-and-hold circuit for sampling an output of the digital-analog converter based on the operating-setting signal, and generating the basic voltage. This configuration makes it possible to continue to hold a proper basic voltage for each function block, to ensure the optimal constant voltage for each function block.

With the present invention, the operating state detection section may further comprise an integrator for integrating the first signal; and a peak detector for detecting a peak value of an output of the integrator, and holding the peak value as the second signal.

Alternatively, in stead of the above described peak detector, the operating state detection section of the present invention may further comprise a peak-to-peak detector for detecting a voltage amplitude of an output of the integrator, and holding the voltage amplitude as the second signal.

This configuration makes it possible to apply negative feedback accurately, even when the manufacturing process has changed the threshold voltages of the P- and N-channel transistors from their design values, and there are differences in the amplitude between the rise and fall of the integrator output.

With the present invention, the operating state encoding section may comprise a plurality of comparators for comparing the voltage level of the second signal with each of a plurality of reference voltage levels; and a encoder for encoding outputs of the plurality of comparators. This makes it easy to use the second signal for encoding, for providing negative feedback.

The operating state encoding section of the present invention may further comprise a plurality of voltage-dividing resistors for dividing the constant voltage from the constant voltage generation section, to create the plurality of reference voltage levels.

This configuration makes it easy to create a preliminary signal when encoding is implemented based on the second signal.

In a semiconductor integrated circuit in accordance with another aspect of the present invention, the at least one operating state detection section is modified into at least one frequency-voltage converter, and the at least one frequency-voltage converter converts the actual operating frequency of the at least one function block into a voltage level.

As described previously, a second signal that indicates the operating state of each function block is generated based on a first signal containing the actual operating frequency of that function block, then the optimal power voltage necessary for the operation of the function block is obtained therefrom.

This frequency-voltage converter preferably converts a frequency of an input signal that is input to the function block into a voltage level. This is because the input signal usually contains the maximum frequency among the signals within the function block, so it reflects the actual operating frequency of the function block.

Since power consumption can be reduced in electronic equipment in accordance with the present invention, which comprises the above semiconductor integrated circuit, it can be applied as appropriate to many different applications, particularly to timepieces, mobile computers, and portable phones.

BEST MODE FOR CARRYING OUT THE INVENTION

First Embodiment

A first embodiment of the present invention is described below with reference to FIGS. 1 to 6.

Figure 1:
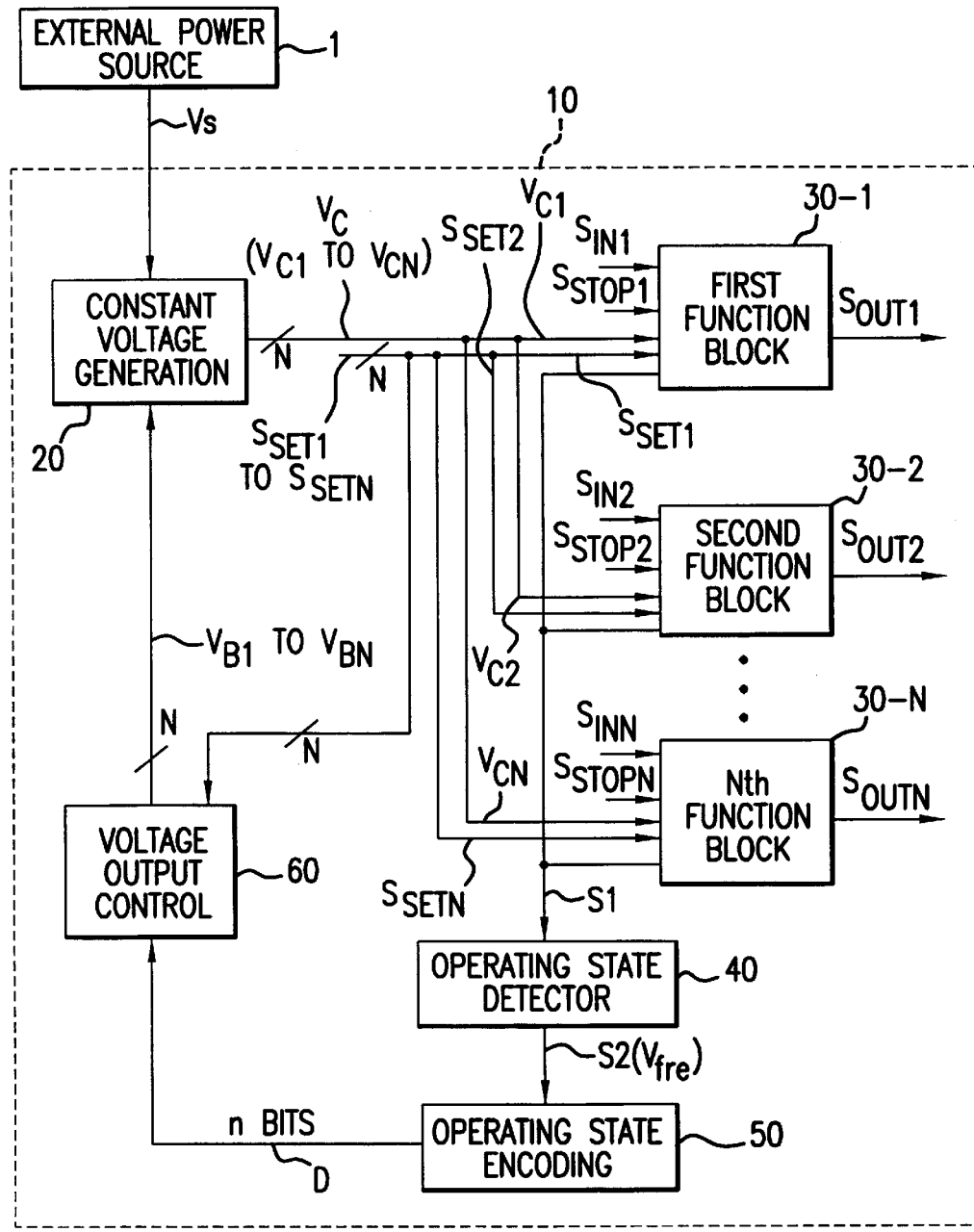
FIG. 1 is a block diagram of a first embodiment of the present invention.

FIG. 1 is a block diagram of the overall structure of the device in accordance with an embodiment of the present invention. In FIG. 1, the device of this embodiment comprises an external power source 1 and a semiconductor integrated circuit 10. The semiconductor integrated circuit 10 comprises a constant voltage generation section 20, first to Nth function blocks 30-1 to 30-N, an operating state detector 40, an operating state encoding section 50, and a voltage output control section 60.

The device of this embodiment is characterized in that constant voltages $V_C$ ($V_{C1}$ to $V_{CN}$) that are supplied to the first to Nth function blocks 30-1 to 30-N. respectively, can be controlled by negative feedback based on the operating states of the corresponding first to Nth function blocks 30-1 to 30-N, in other words, their actual operating frequencies.

A power voltage $V_S$ that is output from the external power source 1 is supplied to the constant voltage generation section 20, where the constant voltages $V_{C1}$ to $V_{CN}$ are generated with reference to basic voltages $V_{B1}$ to $V_{BN}$. The constant voltages $V_{C1}$ to $V_{CN}$ generated by the constant voltage generation section 20 are supplied as power voltages to the corresponding first to Nth function blocks 30-1 to 30-N. The first to Nth function blocks 30-1 to 30-N use their specific functions to modify corresponding input signals $V_{IN1}$ to $V_{INN}$ and generate corresponding output signals $V_{OUT1}$ to $V_{OUTN}$. When the operation stopping signals $S_{STOP1}$ to $S_{STOPN}$ are non-active (i.e., are at the 1-state) and the operation determination setting signals $S_{SET1}$ to $S_{SETN}$ are active (i.e., are at the 1-state), the input signals $V_{IN1}$ to $V_{INN}$ that are input to the corresponding first to Nth function blocks 30-1 to 30-N are output as the operation signal S1 without change to the operating state detector 40.

When the operation determination setting signals $S_{SET1}$ to $S_{SETN}$ are at the 0-state, the operation signal S1 is not generated from the first to Nth function blocks 30-1 to 30-N. Note that each of the operation determination setting signals $S_{SET1}$ to $S_{SETN}$ becomes active at a different timing on the time axis. Therefore, the operating states of the first to Nth function blocks 30-1 to 30-N are detected by the operating state detector 40 at correspondingly different timings.

The operating state detector 40 outputs to the operating state encoding section 50 an operating state signal S2 having a voltage $V_{fre}$ corresponding to the operating states of the first to Nth function blocks 30-1 to 30-N, in other words, their actual operating frequencies, based on the operation signal S1. This means that the operating state detector 40 functions as a frequency-voltage converter.

The operating state encoding section 50 detects the voltage $V_{fre}$ of the operating state signal S2 and generates n-bit digitized operating state data D in accordance with voltage level encoding information that has been set previously.

This operating state data D is input to the voltage output control section 60. The voltage output control section 60 converts the operating state data D into voltages in accordance with voltage generation information that was set previously. These converted voltages are supplied to the constant voltage generation section 20 as the basic voltages $V_{B1}$ to $V_{BN}$.

The constant voltage generation section 20 modifies the levels of the constant voltages $V_{C1}$ to $V_{CN}$ forming the power voltages for the first to Nth function blocks 30-1 to 30-N, based on the thus-supplied basic voltages $V_{B1}$ to $V_{BN}$.

Figure 2:
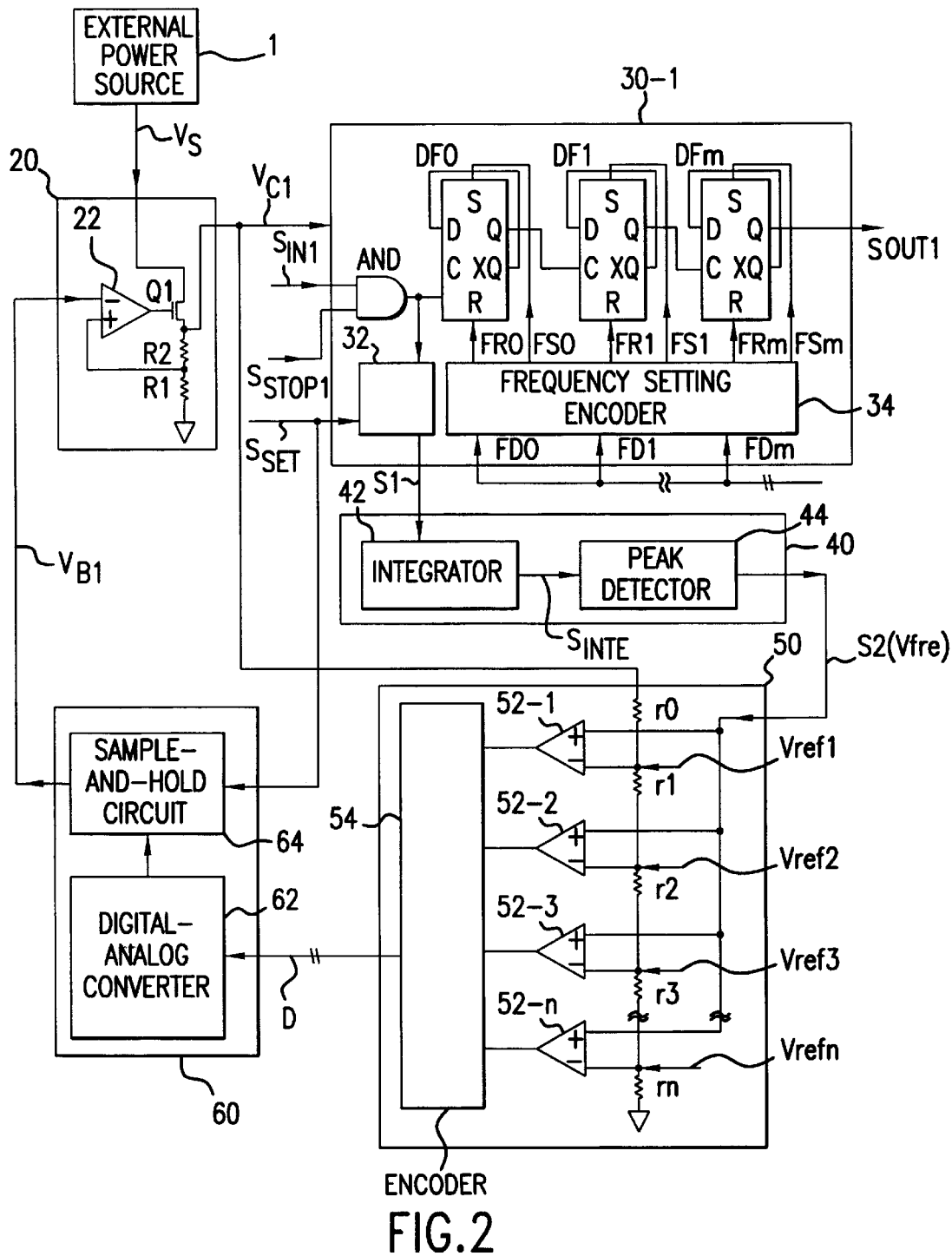
FIG. 2 is a block diagram showing details of a configuration in which a first function block of FIG. 1 is operating as a frequency converter and negative feedback is used to modify the constant voltage supplied to that frequency converter.
Figure 3:
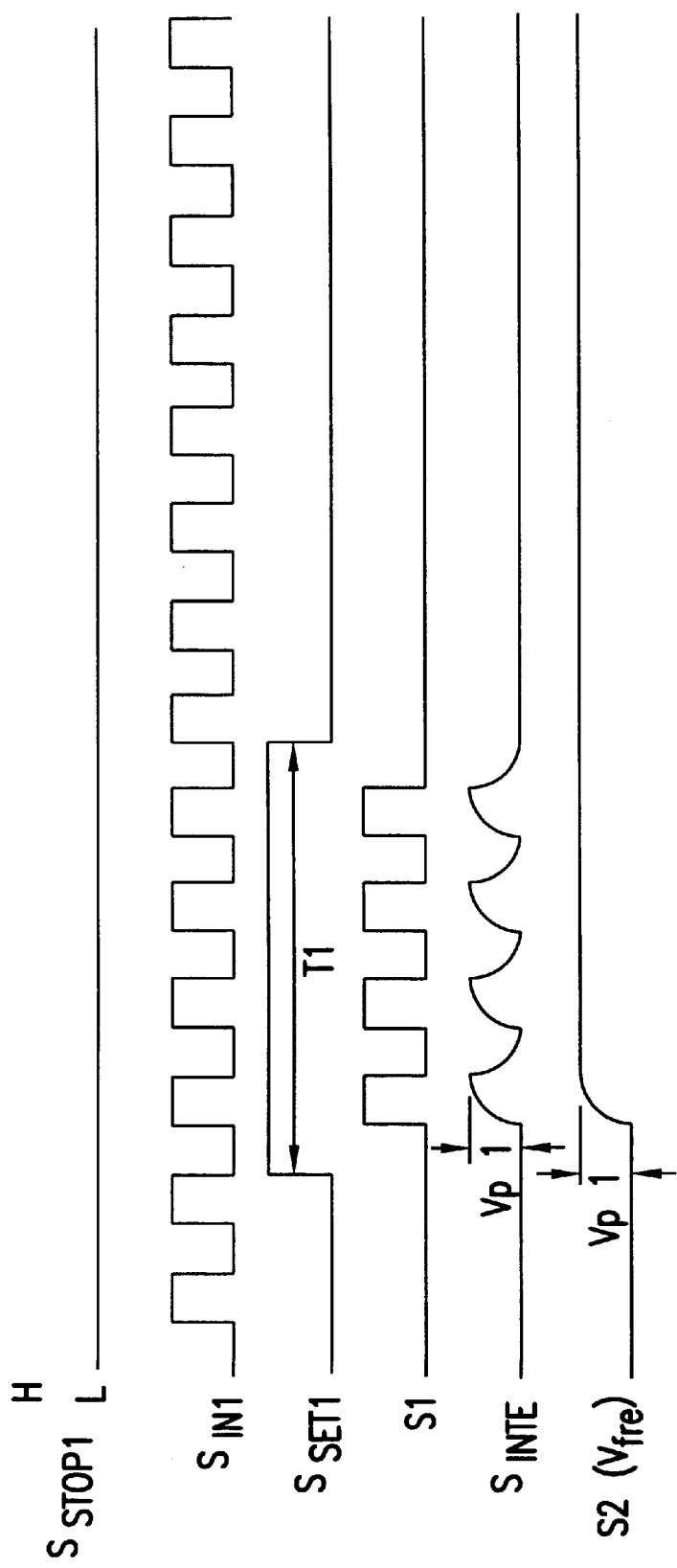
FIG. 3 is a timing chart showing signal waveforms during the process of applying negative feedback in the configuration of FIG. 2.
Figure 4:
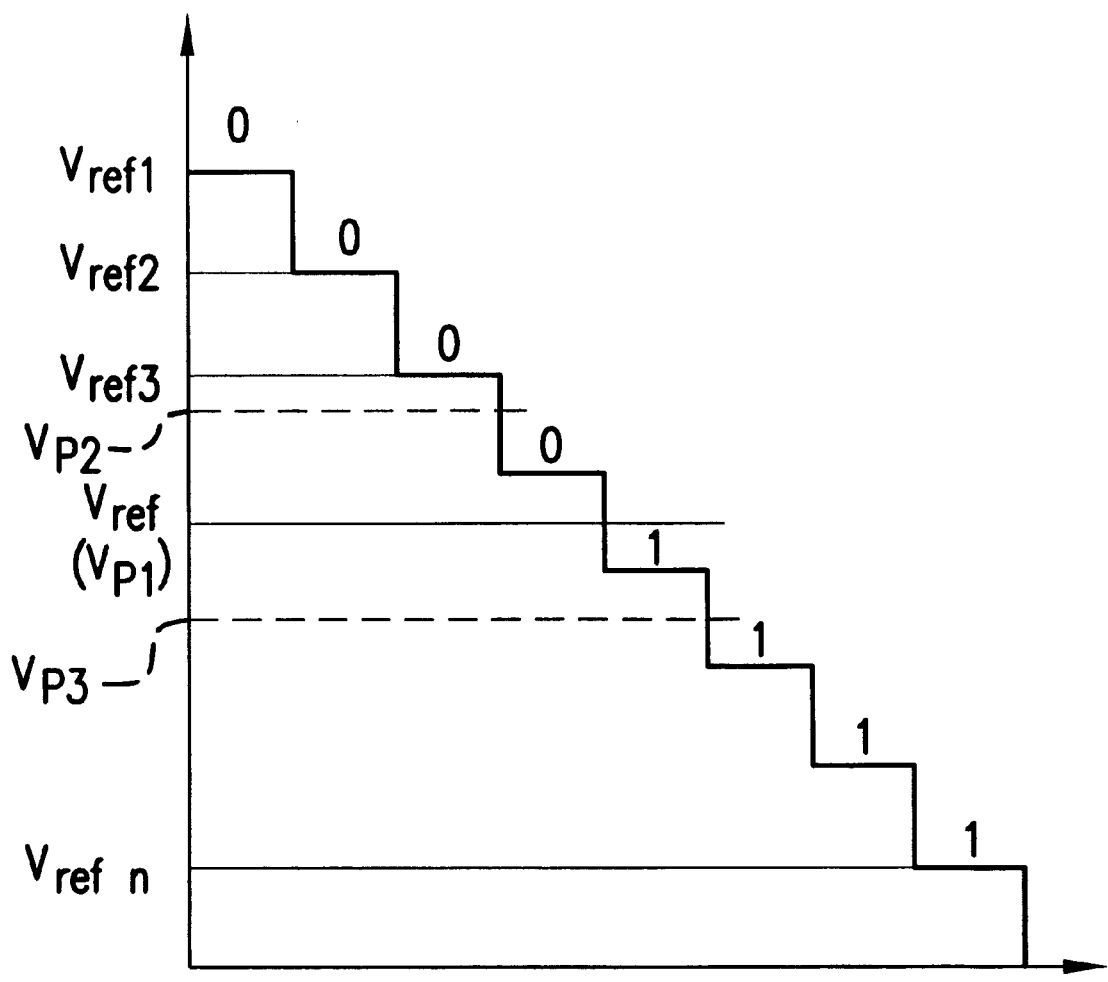
FIG. 4 is a schematic view illustrating the operation of the operating state encoding section of FIG. 2.

The description now turns to the operation and a specific configuration for modifying and controlling the constant voltage $V_{C1}$ of the first function block 30-1 of FIG. 1 by negative feedback, with reference to FIGS. 2 to 4.

FIG. 2 is a block diagram of a specific configuration for modifying and controlling the constant voltage $V_{C1}$ of the first function block 30-1 by negative feedback.

The power voltage $V_S$ that is output from the external power source 1 is supplied to the constant voltage generation section 20, which generates the constant voltage $V_{C1}$ with reference to the basic voltage $V_{B1}$. This constant voltage generation section 20 comprises an operational amplifier 22, a transistor Q1, and two resistors R1 and R2. The basic voltage $V_{B1}$ from the voltage output control section 60 is connected to an inverted-input pin of the operational amplifier 22 and the connection point between the resistors R1 and R2 is connected to a direct-input pin of the operational amplifier 22. This configuration ensures that the operational amplifier 22 and the other components form a negative feedback amplification circuit, such that if the voltage at the direct-input pin varies with respect to the basic voltage $V_{B1}$, the output of the operational amplifier 22 is also changed, ensuring that the output of the operational amplifier 22 is stable. The voltage $V_{C1}$ that is output from the constant voltage generation section 20 during this stage is given by:

$$V_{C1} = V_{B1} \times R1/(R1+R2)$$

It is clear that, if the basic voltage $V_{B1}$ varies, the constant voltage $V_{C1}$ can also be varied in this manner.

Note that the constant voltage generation section 20 shown in FIG. 2 does not include the circuitry for generating the constant voltages $V_{C2}$ to $V_{CN}$ to be supplied to the second to Nth function blocks 30-2 to 30-N, based on the basic voltages $V_{B2}$ to $V_{BN}$, but in actual practice there will be N negative feedback amplification circuits, comprising the operational amplifier 22, the transistor Q1, and the resistors R1 and R2 within the constant voltage generation section 20. In the state before negative feedback is applied, the basic voltages $V_{B1}$ to $V_{BN}$ are set to initial voltages.

The constant voltage $V_{C1}$ that is generated by the constant voltage generation section 20 is applied as the power voltage to the first function block 30-1. The first function block 30-1 modifies any input signal $S_{IN1}$ into any frequency to generate the output signal $V_{OUT1}$, by using flip-flops $D_{F0}$ to $D_{Fm}$ and frequency-switching signals $F_{D0}$ to $F_{Dm}$, in accordance with setting signals $F_{S0}$ to $F_{Sm}$ and resetting signals $F_{R0}$ to $F_{Rm}$ that are generated by a frequency setting encoder 34.

The signal $S_{IN1}$ that has been input to the first function block 30-1 is input to a logical product gate AND together with the function stop signal $S_{STOP1}$, and the input signal $S_{IN1}$ is output without change in the function stop signal $S_{STOP1}$ is non-active, in other words, when it is at the 1-state. When the function stop signal $S_{STOP1}$ is active, in other words, at the 0-state, the logical product gate AND does not transmit the input signal $S_{IN1}$; it controls the input signal $S_{IN1}$ to be at the 0-state and stops the functioning of the first function block 30-1.

The input signal $S_{IN1}$ that is output when the function stop signal $S_{STOP1}$ is at the 1-state is output to the operating state detector 40 (see FIG. 3) as the operation signal S1 through the operating state transmitter 32, when the operation determination setting signal $S_{SET1}$ is at the 1-state (period $T_1$ in FIG. 3). Note that when the operation determination setting signal $S_{SET1}$ is in the 0-state, the input signal $S_{In1}$ is not transferred to the operating state transmitter 32 and the operation signal S1 remains at the 0-state.

The operating state detector 40 comprises an integrator 42 and a peak detector 44. The input operation signal S1 is integrated by the integrator 42 to become an integration signal $S_{INTE}$. The peak value of this integration signal $S_{INTE}$ is held by the peak detector 44 and the operating state signal S2 is generated therefrom (see FIG. 3).

As described previously, the operating state detector 40 functions as a frequency-voltage converter for detecting a voltage corresponding to the actual operating frequency of the first function block 30-1, in order to detect the operating state of the first function block 30-1. To ensure that the input signal $S_{IN1}$ contains the maximum frequency of all the signals that are used by the first function block 30-1, the configuration is generally such that the operating state detector 40 of this embodiment integrates the input signal $S_{IN1}$ and holds the peak value thereof. Therefore, the voltage $V_{fre}$ of the operating state signal S2, which is the output of the operating state detector 40, is at a level corresponding to the actual operating frequency of the first function block 30-1.

This operating state signal S2 is input to the operating state encoding section 50. This operating state encoding section 50 comprises resistors $r_0$ to $r_n$, voltage comparators 52-1 to 52-n, and a encoder 54. The resistors $r_0$ to $r_n$ are connected in series and the constant voltage $V_{C1}$ is applied to the resistor $r_0$. This constant voltage $V_{C1}$ is divided by the resistors $r_0$ to $r_n$ to generate reference voltages $V_{ref1}$ to $V_{refn}$ at the connection points of respective resistors.

The voltage $V_{fre}$ of the operating state signal S2 is input in common to the direct-input pins of n voltage comparators 52-1 to 52-n, and the reference voltages $V_{ref1}$ to $V_{refn}$ are input individually to the corresponding inverted-input pins thereof.

Thus the n voltage comparators 52-1 to 52-n compare the corresponding reference voltages $V_{ref1}$ to $V_{refn}$ with the voltage of the operating state signal S2. This will be described below with reference to FIG. 4. Voltage is plotted along the vertical axis of FIG. 4 and if the resistances for the previously described reference voltages $V_{ref1}$ to $V_{refn}$ are all the same, the relationships between the reference voltages $V_{ref1}$ to $V_{refn}$ are as shown in FIG. 4. If the level of the voltage $V_{fre}$ of the operating state signal S2 is $V_{P1}$, as shown in FIG. 4, the outputs of then voltage comparators 52-1 to 52-n is expressed as (00001111) if represented in sequence by 1 or 0 for n=8.

The outputs of these n voltage comparators 52-1 to 52-n are input to the encoder 54 where they are encoded. The decoder 54 inverts the string of data (00001111) of the signals input from the n voltage comparators 52-1 to 52-n, from the most significant bit to the least significant bit, for the encoding. This means that the output of the encoder 54 is (11110000) in the above-described example. Otherwise, if the voltage $V_{fre}$ of the operating state signal S2 is determined to be the maximum value $V_{ref1}$ of the comparison voltage, for example, the encoder 54 encodes the minimum digital data (00000000); if it is determined to be the minimum value $V_{refn}$, for example, it encodes the maximum digital data (11111111); to generate the n-bit operating state data D.

This operating state data D is input to the voltage output control section 60 which is configured of a digital-analog converter 62 and a sample-and-hold circuit 64. Thus input operating state data D, which is n-bit digital data, is converted by the digital-analog converter 62 to an analog voltage. Further, the analog voltage is sampled by the operating-setting signal $S_{SET1}$ at the sample-and-hold circuit 64, and the level of the analog voltage is held when the operating-setting period ends (when the operating-setting signal $S_{SET1}$ switches from 1 to 0), to modify the basic voltage of the constant voltage generation section 20 from the initial voltage to $V_{B1}$. The constant voltage generation section 20 modifies the level of the constant voltage $V_{C1}$ based on the modified basic voltage $V_{B1}$, as described previously. As a result, the first function block 30-1 is supplied with the constant voltage $V_{C1}$ fitting to the operating state thereof, as the power voltage.

Figure 5:
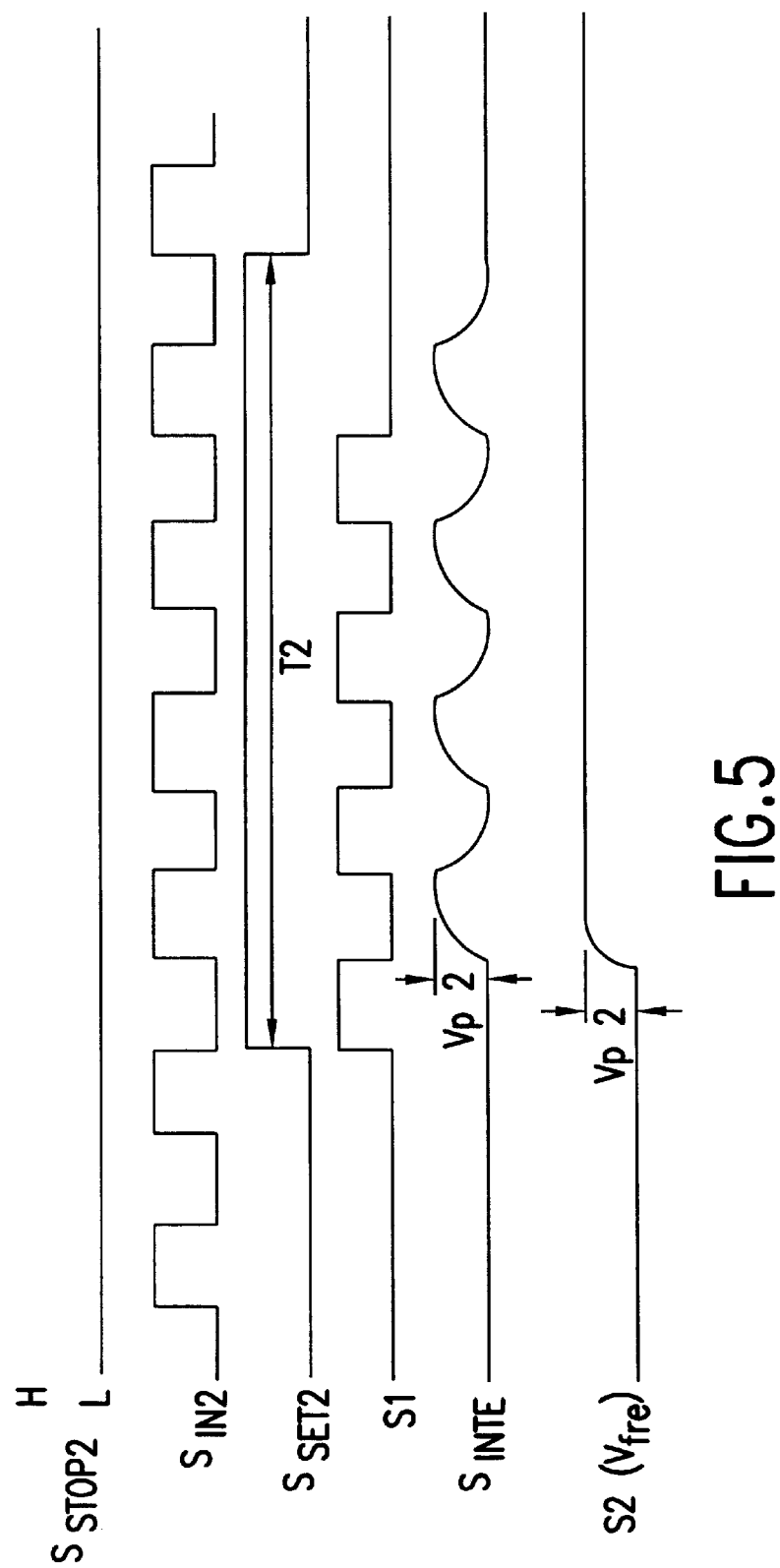
FIG. 5 is a timing chart showing signal waveforms during the process of using negative feedback to modify the constant voltage supplied to the second function block.
Figure 6:
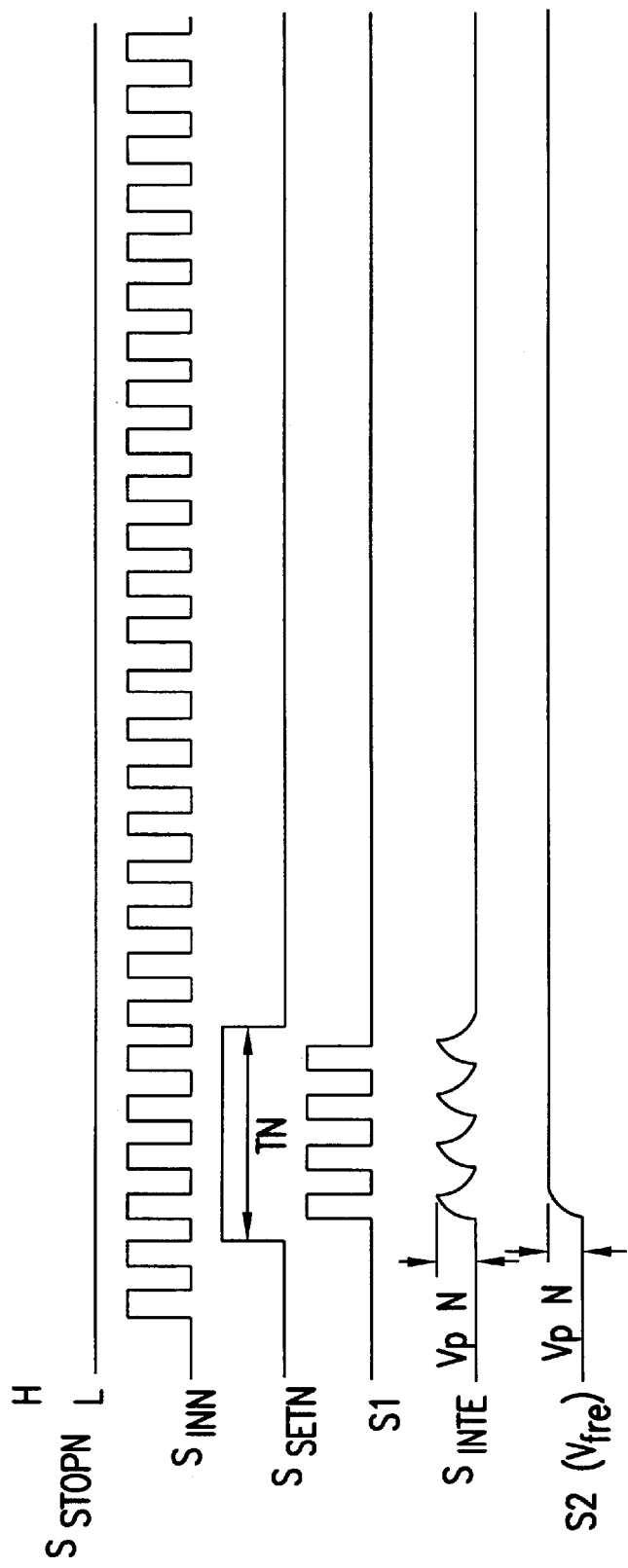
FIG. 6 is a timing chart showing signal waveforms during the process of using negative feedback to modify the constant voltage supplied to the Nth function block.

Signal waveforms used in the process of modifying the constant voltages $V_{C2}$ and $V_{CN}$ by negative feedback for the second function block 30-2 and the Nth function block 30-N in the circuit of FIG. 1 are shown in FIGS. 5 and 6, respectively, in a similar manner to that of FIG. 3.

In this case, the periods $T_1$, $T_2$, and $T_N$ during which the corresponding operation determination setting signals $S_{SET1}$, $S_{SET2}$, and $S_{SETN}$ are active in FIGS. 3, 5, and 6 are set to different timings on the time axis. This ensures that a negative feedback amplification circuit comprising the operating state detector 40, the operating state encoding section 50, the voltage output control section 60, and the constant voltage generation section 20 can be used in common by a plurality of function blocks which are the first to Nth function blocks 30-1 to 30-N.

It is clear from a comparison of FIGS. 3, 5, and 6 in this case that, if the frequencies of the input signals $S_{IN1}$, $S_{IN2}$, and $S_{INN}$ that are input to the first, second, and Nth function blocks 30-1, 30-2, and 30-N are $S_{fre1}$, $S_{fre2}$, and $S_{freN}$, respectively, their relationship is such that: $S_{fre2} < S_{fre1} < S_{freN}$. In addition, the effective value (area under the rectangular waveform) of the input signal increases as the operating frequency decreases, so that the power consumed by the function block increases.

With this embodiment, if the power consumption of a function block is increasing, the constant voltage that is supplied thereto decreases, so that the power consumed thereby decreases.

The relationships between the peak voltage $V_{P1}$ of the operating state signal S2 of FIG. 3 and the peak voltages $V_{P2}$ and $V_{PN}$ of the operating state signal S2 of FIGS. 5 and 6 are such that: $V_{PN} < V_{P1} < V_{P2}$. Thus the relationships between the basic voltages $V_{B1}$, $V_{B2}$, and $V_{BN}$ generates by the sample-and-hold circuit 64 are $V_{B2} < V_{B1} < V_{BN}$. This makes it possible to reduce the constant voltage supplied to a function block in which the operating frequency has dropped, enabling a reduction in power consumption.

Second Embodiment

Figure 7:
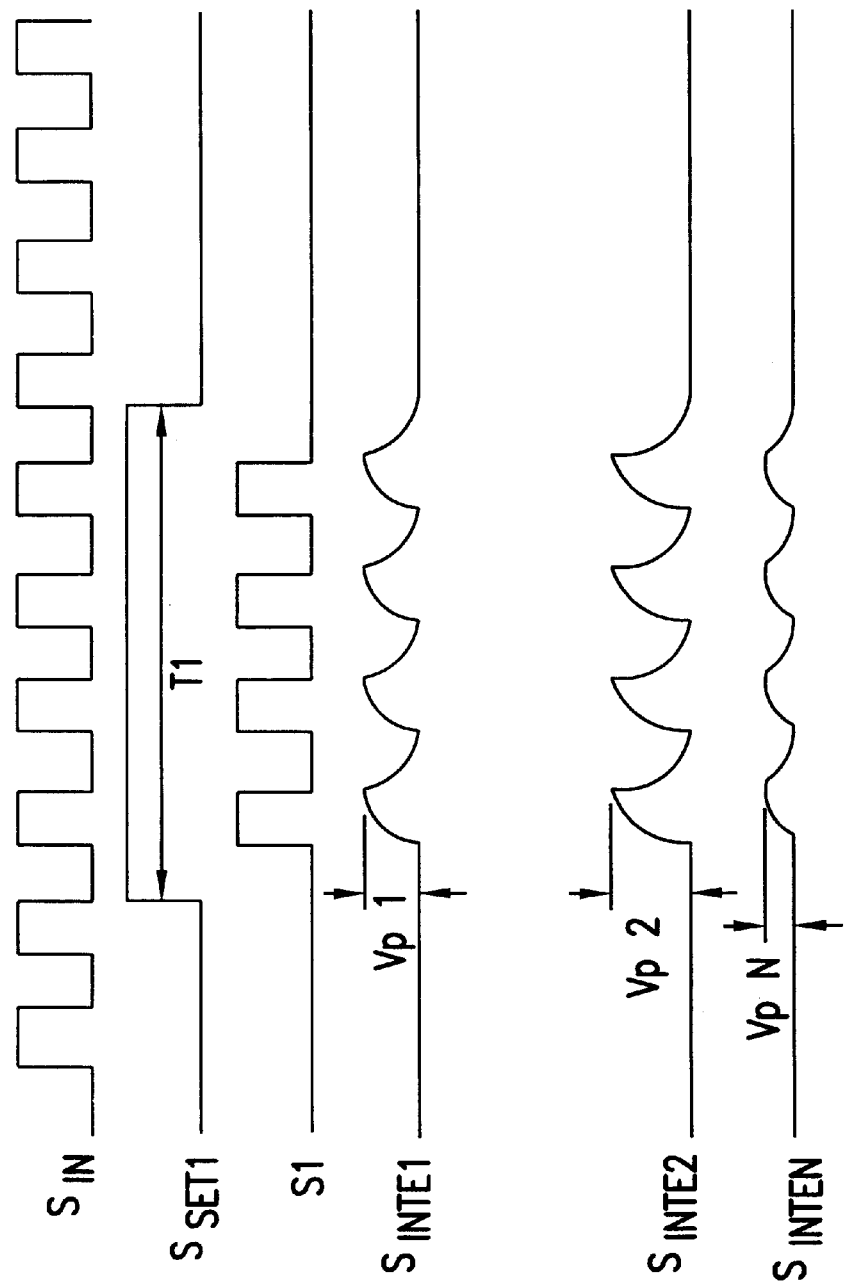
FIG. 7 is a timing chart of a second embodiment of the present invention, showing the signal waveforms during the process of using negative feedback to modify the constant voltages supplied to function blocks to which the same input signal is input, when the threshold voltages Vth of the MOS transistors configuring the function blocks of FIG. 1 are different.

The timing chart of FIG. 7 shows the signal waveforms obtained when the threshold voltages of MOS transistors that configure the semiconductor integrated circuit 10 of FIG. 1 are different for each function block, and the circuitry of FIGS. 1 and 2 is used to apply negative feedback, in a similar manner to that of FIG. 3.

In this case, if the threshold voltage of the MOS transistor of the first function block 30-1 is assumed to be $V_{th1}$, the threshold voltage of the MOS transistor of the second function block 30-2 is assumed to be $V_{th2}$, and the threshold voltage of the MOS transistor of the Nth function block 30-N is assumed to be $V_{thN}$, the relationships between these threshold voltages are: $V_{th2} < V_{th1} < V_{thN}$.

When the constant voltage $V_{C1}$ of the first function block 30-1 is modified by negative feedback, the threshold voltage of the MOS transistor is $V_{th1}$, and thus the peak value of an integration signal $S_{INTE1}$ from the integrator 42 is $V_{P1}$. Similarly, when the constant voltages $V_{C2}$ and $V_{CN}$ of the second and Nth function blocks 30-2 and 30-N are modified, the threshold voltages of the MOS transistors in each block are $V_{th2}$ and $V_{thN}$, and thus integration signals $S_{INTE2}$ and $S_{INTEN}$ from the integrator 42 are at $V_{P2}$ and $V_{PN}$, respectively.

With the previously described embodiment, the peak value of the input signal $S_{IN}$ is different if the frequency thereof is different, but with this embodiment, differences in the threshold voltages of the MOS transistors configuring the function blocks ensures that the peak values are still different, even if an input signal $S_{IN}$ of the same frequency shown in FIG. 7 is input to each of the function blocks 30-1, 30-2, and 30-N. It should be noted that although only the operating-setting signal $S_{SET1}$ is shown to be active during the period $T_1$ in FIG. 7, the peak values $V_{P2}$ and $V_{PN}$ described above are detected in periods $T_2$ and $T_N$ during which the operating-setting signals $S_{SET2}$ and $S_{SETN}$ are active, respectively. The relationships between these peak values is, as shown in FIG. 7, such that: $V_{PN} < V_{P1} < V_{P2}$.

Since the threshold voltage of a MOS transistor changes depending on factors present during the manufacturing process, therefore, the relationship of the threshold voltage $V_{th}$ and the voltage $V_{In}$ of the input signal $S_{IN}$ with respect to the on-resistance Ron of the MOS transistor when it is operating is: $Ron=1/(K \times V_{IN}-V_{th})$. This constant K is determined by the manufacturing process of the semiconductor integrated circuit and the physical form of the MOS transistor. Thus, if the voltage $V_{IN}$ of the input signal $S_{IN}$ is the same and the constant K is fixed, the on-resistance Ron of the MOS transistor changes with variations in the threshold voltage $V_{th}$ thereof. This means that the on-resistance Ron increases when the threshold voltage $V_{th}$ increases, and the on-resistance Ron decreases when the threshold voltage $V_{th}$ decreases. Thus the voltage amplitude of the integration signal $S_{INTE}$ changes as the output impedance of the signal that is input to the integrator 42 changes.

The relationship between the on-resistance Ron and $V_{th}$ of the MOS transistor ensures that the relationships between the peak voltage $V_{P1}$, the peak voltage $V_{P2}$, and the peak voltage $V_{PN}$ are, as mentioned previously: $V_{PN}<V_{P1}<V_{P2}$.

In this embodiment too, the constant voltages $V_{C1}$, $V_{C2}$, and $V_{CN}$ supplied to the corresponding function blocks 30-1, 30-2, and 30-N are modified by negative feedback based on the basic voltages $V_{B1}$, $V_{B2}$, and $V_{BN}$ that are modified in accordance with the peak voltages thereof, so that there is no variation in frequency response speed between the first to Nth function blocks 30-1 to 30-N, even when an input signal $S_{IN}$ of the same frequency is input to the function blocks 30-1 to 30-N.

Third Embodiment

Figure 8:
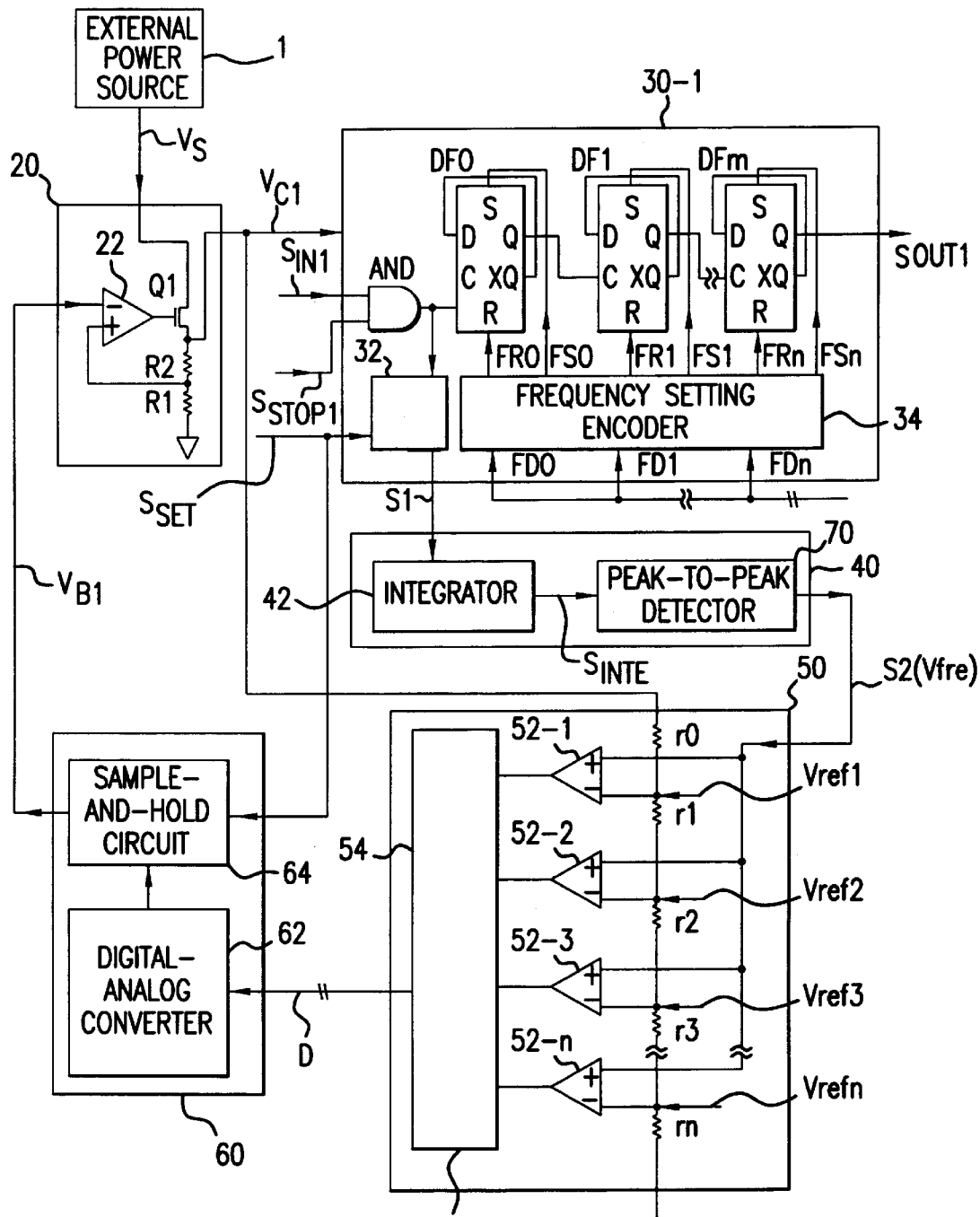
FIG. 8 is a block diagram of a device in accordance with a third embodiment of the present invention.

A block diagram of a circuit in accordance with a third embodiment of the present invention is shown in FIG. 8. The circuit of FIG. 8 differs from the circuit shown in FIG. 2 in that a peak-to-peak detector 70 is used instead of the peak detector 44 of FIG. 2.

This peak-to-peak detector 70 differs from the peak detector 44 in that it holds the voltage amplitude of the integration signal $S_{INTE1}$, in contrast to the peak detector 44 which detects and hold the peak value of the integration signal $S_{INTE1}$.

Figure 9:
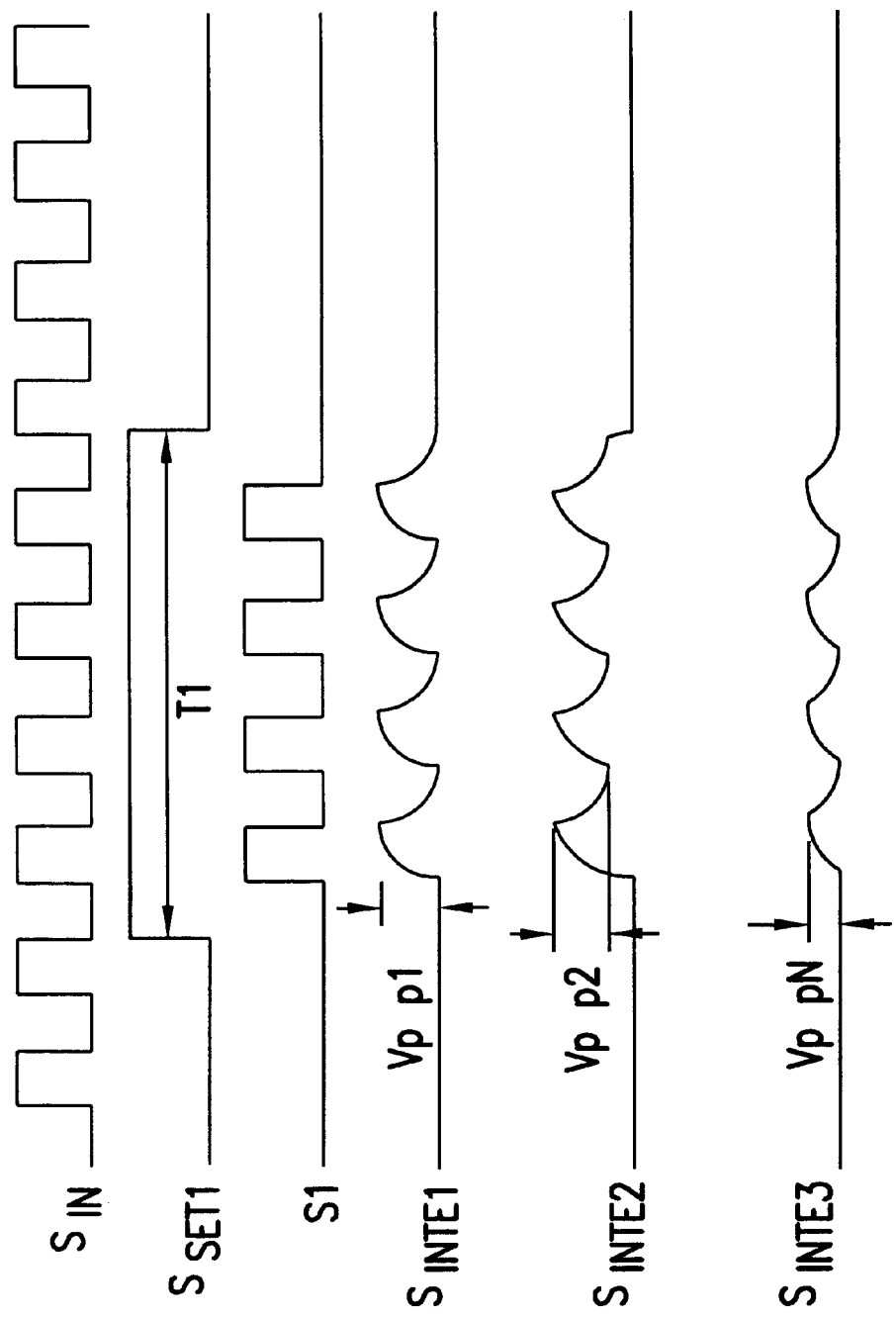
FIG. 9 is a timing chart showing signal waveforms during the process of using negative feedback to modify the constant voltage supplied to the plurality of function blocks used in the circuit of FIG. 8.

The timing chart of FIG. 9 shows the signal waveforms obtained when the threshold voltages of MOS transistors that configure the semiconductor integrated circuit 10 of FIG. 1 are different for each function block, and the circuitry of FIGS. 1 and 8 is used to apply negative feedback.

The relationships between the threshold voltages of P-channel MOS transistors configuring the first, second, and Nth function blocks 30-1, 30-2, and 30-N are such that: $V_{thp2}<V_{thp1}<V_{thpN}$.

In this case, the threshold voltage of the P-channel MOS transistor of the first function block 30-1 is $V_{thp1}$, the threshold voltage of an N-channel MOS transistor is $V_{thn1}$, and the voltage amplitude of the integration signal $S_{INTE1}$ generated by the integrator 42 is $V_{pp1}$ (see FIG. 9).

The threshold voltage of the P-channel MOS transistor of the second function block 30-2 is $V_{thp2}$, the threshold voltage of an N-channel MOS transistor is $V_{thn2}$, and the voltage amplitude of the integration signal $S_{INTE2}$ generated by the integrator 42 is $V_{pp2}$ (see FIG. 9).

The threshold voltage of the P-channel MOS transistor of the Nth function block 30-N is $V_{thpN}$, the threshold voltage of an N-channel MOS transistor is $V_{thnN}$, and the voltage amplitude of the integration signal $S_{INTEN}$ generated by the integrator 42 is $V_{ppN}$ (see FIG. 9).

When the relationships between these voltage amplitudes is, as shown in FIG. 9, such that: $V_{ppN}<V_{pp2}<V_{pp1}$; the relationships between the basic voltages $V_{B1}$, $B_{B2}$, and $V_{BN}$ that are each generated by the sample-and-hold circuit 64 is: $V_{B2}<V_{B1}<V_{BN}$; and the threshold voltages of each of the P-channel MOS transistors and N-channel MOS transistors are different for each function block; there is no variation in frequency response speed between the function blocks, even when an input signal $S_{IN}$ of the same frequency is input to the function blocks, in a similar manner to that exhibited by the second embodiment.

This embodiment is particularly superior to the use of the peak detector 44 of FIG. 2 in that, even if there are differences in amplitude between rise and fall of the initial integrated waveform, the voltage amplitude of the integrated waveforms that are used in common can be detected accurately, as shown in FIG. 9 for the integration signal $S_{INTE2}$.

Fourth Embodiment

Figure 10:
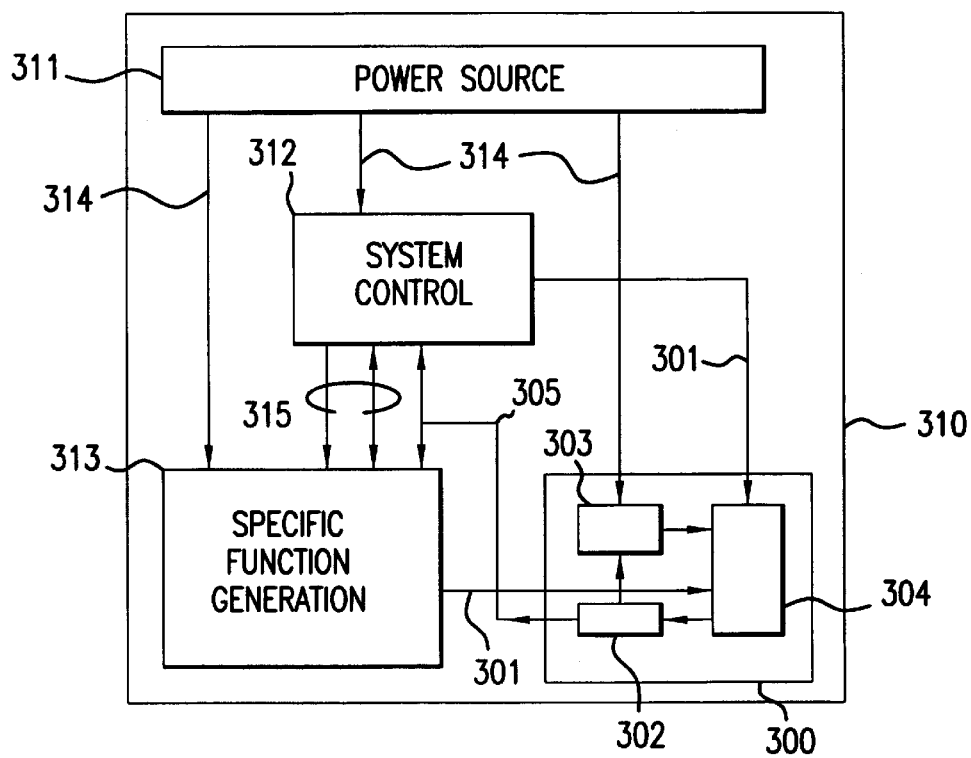
FIG. 10 is a block diagram of electronic equipment in accordance with a fourth embodiment of the present invention.
Figure 11:
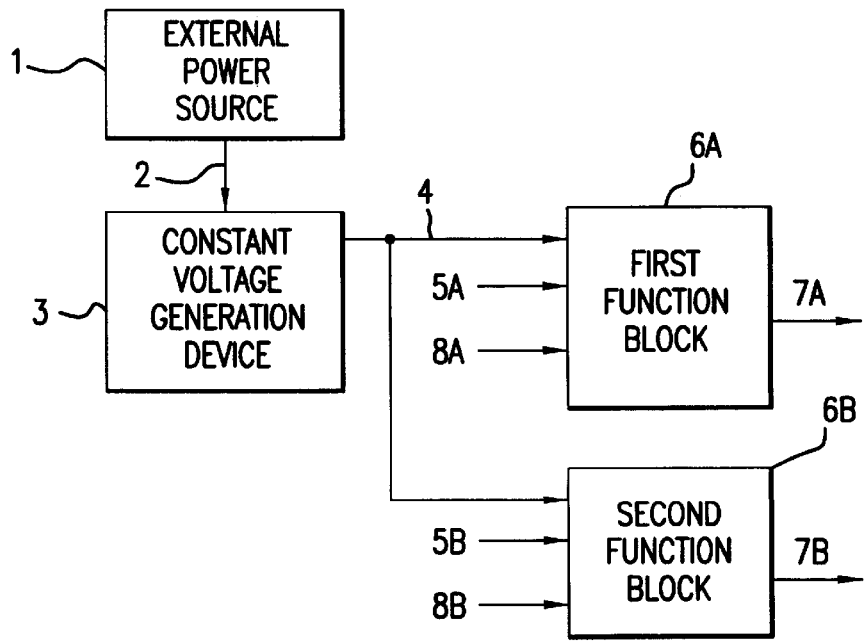
FIG. 11 is a block diagram of a prior-art semiconductor integrated circuit.

A block diagram of electronic equipment that uses a semiconductor integrated circuit having the previously described voltage control section is shown in FIG. 10.

This electronic equipment 310 is configured of a system control section 312, a specific function generation section 313, and a semiconductor integrated circuit 300 that are all driven by a power source 311. The system control section 312 has the function of controlling the entire system of the electronic equipment 310, such as a microprocessor, bus control system, or memory control system. The specific function generation section 313 functions to provide specific control-over a device such as a data transfer device, an internal or external storage device, or a input-output device. The system control section 312 and the specific function generation section 313 are connected by input-output signals 315, for inputting and outputting signals and data. The power source 311 supplies a power voltage 314 to all of structural elements of the electronic equipment 310.

The semiconductor integrated circuit 300 provided within the electronic equipment 310 uses an internal power voltage control section 302 to raise or lower the voltage of an internal constant-voltage source 303 and thus modify the power voltage supplied to a group of function blocks 304, when there is a change in the operating speed of an input signal 301 imparted thereto by the system control section 312 and the specific function generation section 313. When the voltage that is output by the internal constant-voltage source 303 of the semiconductor integrated circuit 300 is modified, the semiconductor integrated circuit 300 generates a detection signal 305 and supplies it to the system control section 312 and the specific function generation section 313. This detection signal 305 is used to convey to the system control section 312 and the specific function generation section 313 the instruction that the power consumption of the semiconductor integrated circuit 300 is being controlled.

Note that the present invention is not limited to the above-described embodiments and various other modifications thereof are possible within the scope of the present invention. For example, the embodiment shown in FIG. 1 uses the constant voltage generation section 20, the operating state detector 40, the operating state encoding section 50, and the voltage output control section 60 in common for the plurality of function blocks 30-1 to 30-N, but these components could be provided individually for each of these function blocks. Similarly, the embodiment of FIG. 1 has a configuration such that power is supplied from one external power source 1 to the semiconductor integrated circuit 10, but the present invention can also be applied to a semiconductor integrated circuit in which different power voltages of, for example, 3 V, 5 V, and so on are supplied from a plurality of external power sources. In such a case, it would be necessary to provide the same number of constant voltage generation sections as external power sources.

What is claimed is:

1. A semiconductor integrated circuit comprising:
   at least one constant voltage generation section for increasing or decreasing a power voltage supplied from at least one external power source, based on a basic voltage, to generate at least one constant voltage;
   at least one function block to which is supplied said at least one constant voltage generated by said at least one constant voltage generation section;
   at least one operating state detection section for generating a second signal indicating an operating state of said at least one function block, based on a first signal including operating speed information of said at least one function block;
   at least one operating state encoding section for encoding the operating state of said function block to generate operating state data, based on said second signal; and
   at least one voltage output control section for modifying said basic voltage of said at least one constant voltage generation section, based on said operating state data;
   wherein an operating-setting signal is input to said at least one function block, and said at least one function block supplies said first signal to said at least one operating state detection section when said operating-setting signal is active.

2. The semiconductor integrated circuit as defined in claim 1; wherein:
   one each of said at least one operating state detection section, said at least one operating state encoding section, said at least one voltage output control section, and said at least one constant voltage generation section is provided in common for said plurality of function blocks; and
   an operating-setting signal becomes active at different timings along the time axis for each of said plurality of function blocks.

3. The semiconductor integrated circuit as defined in claim 1, wherein:
   said at least one voltage output control section comprises:
      a digital-analog converter for performing a digital-to-analog conversion on said operating state data; and
      a sample-and-hold circuit for sampling an output of said digital-analog converter based on said operating-setting signal, and generating said basic voltage.

4. The semiconductor integrated circuit as defined in claim 1, wherein:
   said at least one operating state detection section comprises:
      an integrator for integrating said first signal; and
      a peak detector for detecting a peak value of an output of said integrator, and holding said peak value as said second signal.

5. The semiconductor integrated circuit as defined in claim 1, wherein:
   said at least one operating state detection section comprises:
      an integrator for integrating said first signal; and
      a voltage amplitude detector for detecting a voltage amplitude of an output of said integrator, and holding said voltage amplitude as said second signal.

6. The semiconductor integrated circuit as defined in claim 1, wherein:
   said at least one operating state encoding section comprises:
      a plurality of comparators for comparing the voltage level of said second signal with each of a plurality of reference voltage levels; and
      a encoder for encoding outputs of said plurality of comparators.

7. The semiconductor integrated circuit as defined in claim 6, further comprising:
   a plurality of voltage-dividing resistors for dividing said constant voltage from said at least one constant voltage generation section, to create said plurality of reference voltage levels.

8. A semiconductor integrated circuit comprising:
   at least one constant voltage generation section for increasing or decreasing a power voltage supplied from at least one external power source, based on a basic voltage, to generate at least one constant voltage;
   at least one function block to which is supplied said at least one constant voltage generated by said at least one constant voltage generation section;
   at least one frequency-voltage converter for converting an actual operating frequency of said at least one function block into a voltage level;
   at least one operating state encoding section for encoding an operating state of said function block to generate operating state data, based on the output voltage of said frequency-voltage converter; and
   at least one voltage output control section for modifying said basic voltage of said at least one constant voltage generation section, based on said operating state data.

9. The semiconductor integrated circuit as defined in claim 8, wherein:
   said frequency-voltage converter converts a frequency of an input signal that is input to said at least one function block into a voltage level.

10. The semiconductor integrated circuit as defined in claim 9, wherein:
    an operating-setting signal is input to said at least one function block, and said at least one function block supplies said input signal to said frequency-voltage converter when said operating-setting signal is active.

11. The semiconductor integrated circuit as defined in claim 10, wherein:
    one each of said at least one frequency-voltage converter, said at least one operating state encoding section, said at least one voltage output control section, and said at least one constant voltage generation section is provided in common for said plurality of function blocks; and
    said operating-setting signal becomes active at different timings along the time axis for each of said plurality of function blocks.

12. Electronic equipment comprising the semiconductor integrated circuit as defined in claim 1.

* * * * *